United States Patent
Ilg

(12) 
(10) Patent No.: US 6,492,688 B1
(45) Date of Patent: Dec. 10, 2002

(54) DUAL WORK FUNCTION CMOS DEVICE

(75) Inventor: Matthias Ilg, Richmond, VA (US)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/260,937

(22) Filed: Mar. 2, 1999

(51) Int. Cl.$^7$ ............................................... H01L 29/76
(52) U.S. Cl. ........................ 257/369; 257/407; 257/412; 257/392
(58) Field of Search ................................ 257/369, 412, 257/407, 392

(56) References Cited

U.S. PATENT DOCUMENTS

| | | | |
|---|---|---|---|
| 4,714,519 A | 12/1987 | Pfiester | 437/81 |
| 4,745,079 A | 5/1988 | Pfiester | 437/29 |
| 4,775,642 A | 10/1988 | Chang et al. | 437/44 |
| 4,966,866 A | 10/1990 | Mikata et al. | 437/193 |
| 5,024,959 A | 6/1991 | Pfiester | 437/34 |
| 5,061,647 A | 10/1991 | Roth et al. | 437/40 |
| 5,214,298 A | * 5/1993 | Yuan et al. | 257/194 |
| 5,329,138 A | 7/1994 | Mitani et al. | 257/42 |
| 5,355,010 A | 10/1994 | Fujii et al. | 257/377 |
| 5,438,007 A | 8/1995 | Vinal et al. | 437/41 |
| 5,464,789 A | 11/1995 | Saito | 437/57 |
| 5,605,861 A | 2/1997 | Appel | 437/164 |
| 5,770,490 A | 6/1998 | Frenette et al. | 438/199 |
| 5,932,919 A | * 8/1999 | Schwalke | 257/369 |
| 6,049,113 A | * 4/2000 | Shida | 257/412 |
| 6,137,145 A | * 10/2000 | Cheek et al. | 257/413 |

FOREIGN PATENT DOCUMENTS

| | | |
|---|---|---|
| EP | 0 657 929 A2 | 6/1995 |
| US | XP-000802753 | 9/1998 |

* cited by examiner

Primary Examiner—Mark V. Prenty
(74) Attorney, Agent, or Firm—Daly, Crowley & Mofford, LLP

(57) ABSTRACT

A method for forming a CMOS device. The method includes forming a gate oxide over a surface of a semiconductor substrate. A first doped layer is formed over the gate oxide. The first doped layer is lithographically patterned comprising selectively removing a portion of such first doped layer to expose a first portion of the gate oxide with the first doped layer remaining disposed over a second laterally positioned portion of the gate oxide. A second doped is deposited over the patterned first doped layer, such second doped layer having a dopant different from, for example a conductivity type opposite to, the dopant of the first doped layer. A portion of the second doped layer is deposited over the exposed first portion of the gate oxide and over the first doped layer to provide a pair of vertically positioned regions. A lower region comprises a portion of the first doped layer and an upper region comprising a portion of the second doped layer. The second doped layer is lithographically patterned to form a pair of laterally spaced gate electrodes for the transistors, one of such gates comprising the patterned first doped layer and the other one of the gates comprising the patterned pair of vertically positioned regions.

14 Claims, 4 Drawing Sheets

DUAL WORK FUNCTION CMOS DEVICE

BACKGROUND OF THE INVENTION

This invention relates generally to semiconductor devices and more particularly dual work function complementary metal oxide semiconductor (CMOS) semiconductor devices.

As is known in the art, it is sometimes desirable to provide CMOS devices in an integrated circuit. A CMOS device includes a pair of electrically isolated field effects transistors (FETs), each transistor having source, drain, and gate electrodes. The source and drain are formed in a semiconductor and are separated by a channel region in the semiconductor. The gates are typically doped silicon (e.g., doped polycrystalline or amorphous silicon) and are disposed over the channels to control the flow of carriers in the channel between the source and drains. One of the transistors has N conductivity type source and drains and is referred to as an NFET, and the other transistor has P conductivity type source and drains as is referred to as a PFET. In a single work function CMOS device, the gates of both transistors are doped with the same conductivity type dopant. In a dual work function CMOS device, both FETs have their gate dopants selected to optimize the performance of the CMOS device. Thus, with a dual work function CMOS device, one of the gates may be doped with a dopant different from the dopant of the other one of the gates.

SUMMARY OF THE INVENTION

In accordance with one embodiment of the invention, a method is provided for forming a CMOS device. The method includes forming a gate oxide over a surface of a semiconductor substrate. A first doped layer is formed over the gate oxide. The first doped layer is lithographically patterned comprising selectively removing a portion of such first doped layer to expose a first portion of the gate oxide with the first doped layer remaining disposed over a second laterally disposed portion of the gate oxide. A second doped layer is deposited over the patterned first doped layer. The second doped layer has a dopant different from, for example, a conductivity type opposite to, the dopant of the first doped layer. A portion of the second doped layer is deposited over the exposed first portion of the gate oxide and over the portion of the first doped layer to provide a pair of vertically positioned regions. A lower region comprises a portion of the first doped layer and an upper region comprising a portion of the second doped layer. The second doped layer is lithographically patterned to form a pair of laterally spaced gates for the transistors, one of such gates comprising the patterned first doped layer and the other one of the gates comprising the patterned pair of vertically positioned regions.

In accordance with another embodiment, the second dopant is distributed in the second gate among a lower portion of the first dopant in such second gate.

In accordance with another embodiment, the distribution comprises heating the dopant in the second gate.

In accordance with another embodiment, the first doped layer depositing comprises forming the first doped layer with silicon.

In accordance with another embodiment, the first and second doped layer depositing comprises forming the first and second doped layer with silicon.

In accordance with another embodiment, the silicon is doped polycrystalline or doped amorphous silicon.

In accordance with another embodiment, the first and second doped layers are deposited to different thickness.

In accordance with another feature of the invention, a pair of field effect transistors is provided. Such pair of transistors includes a semiconductor substrate. A gate oxide is disposed over a surface of the substrate. A first gate for a first one of the transistors is disposed over a first portion of the gate oxide, such first gate comprising a first dopant region. A second gate for a second one of the transistors is disposed over a second portion of the gate oxide, such second portion of the gate oxide being laterally spaced from the first portion of the gate oxide. The second gate comprises a pair of vertically disposed doped regions. The second one of the doped regions comprises the first dopant and is disposed above the first doped region. In one embodiment, the first dopant has a first conductivity type dopant is opposite to the second conductivity type dopant.

In accordance with one embodiment of the invention, an upper portion of the second conductivity type dopant in the second gate is distributed among a lower portion of the first dopant in such second gate.

In accordance with another embodiment, the first gate comprises doped silicon.

In accordance with still another embodiment, the silicon is polycrystalline or amorphous silicon.

In accordance with another embodiment, the first gate comprises doped silicon and the pair of regions of the second gate comprise silicon.

In accordance with another embodiment, the silicon is polycrystalline or amorphous silicon.

In accordance with another embodiment, an upper portion of the second dopant in the second gate is distributed among a lower portion of the first dopant in such second gate.

BRIEF DESCRIPTION OF THE DRAWING

These and other features of the invention will become more readily apparent from the following detail description when read together with the accompanying drawings, in which.

DESCRIPTION OF THE PREFERRED EMBODIMENTS

Figure 1:
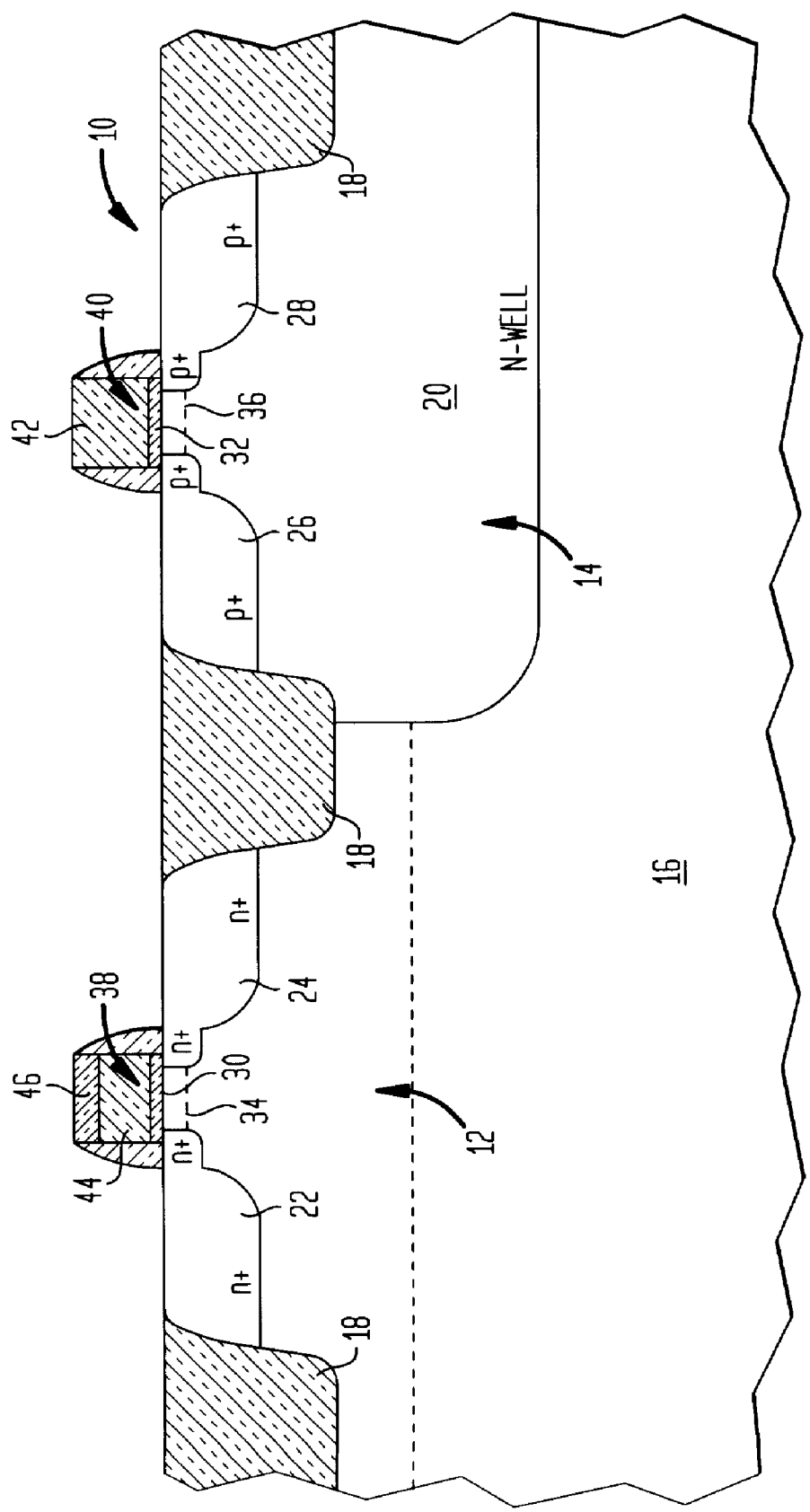
FIG. 1 is a cross-sectional diagrammatical sketch of a dual work function CMOS device in accordance with the invention.

Referring now to FIG. 1, a dual work function CMOS device 10 is shown to include a pair of field effect transistors (FETS) 12, 14 formed on a single crystal, here p-conductivity type doped silicon semiconductor substrate 16. The FETs 12, 14 are electrically isolated by a dielectric (Local Oxidation, LOCOS) region 18 formed in the substrate 16. An N type doped well 20 is also formed in one of the isolated regions of the substrate. An NFET, here FET 12, having N⁺ conductivity type source and drain regions 22, 24 in the p- conductivity type substrate is provided in one of the isolated regions and a PFET, here FET 14 having P+ conductivity type source and drain regions 26, 28 in the n-conductivity type well 20 is provided in the other one of the isolated regions. Gate oxide pads 30, 32 are disposed over the channel regions 34, 36, respectively, provided in the substrate 12 between the source and drain regions 22, 24 and 26, 28, respectively of the NFET 12 and PFET 14, respectively. A doped gate 38, 40 is disposed over each of the gate oxide pads 30, 32, respectively, as shown. The gate 40 for the PFET 14 includes a p-conductivity type doped silicon layer 42, here, for example polycrystalline or amorphous silicon. The gate 38 for the NFET 12 includes a pair of vertically disposed doped regions 44, 46; the region 44 being of n-conductivity type doped silicon, here, for example polycrystalline or amorphous silicon and being disposed adjacent to gate oxide pad 34 and the doped region 46 being of the same p-conductivity type doped silicon material used for the layer 42 of gate 40 of the PFET 14. This region 46 is disposed above the doped region 44. Thus, the gates 38, 40 of the FETS 12, 14, respectively, have different work functions.

Referring now to FIGS. 2A through 2G, the process for forming the dual work function CMOS device 10 (FIG. 1) will be described. Thus, referring to FIG. 2A, the p-type doped silicon substrate 12 is provided. Electrically isolated regions are provided laterally along the substrate here using conventional LOCOS isolation 18. Further, the n conductivity type well 20 is provided in one of the isolated regions a thermally grown gate oxide layer 31 is disposed over the upper surface of the substrate 12, as indicated.

Figure 2A:
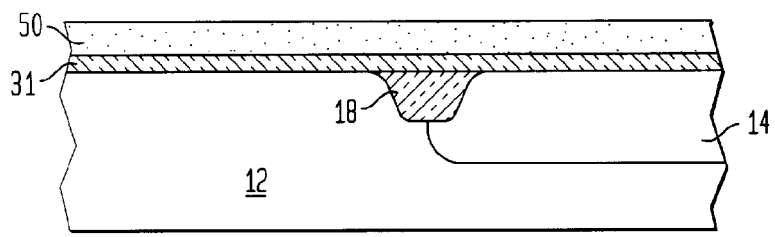
FIGS. 2A through 2G are cross-sectional diagrammatical sketches of a semiconductor body at various stages in the processing thereof in accordance with the invention, such steps being used to form the dual work function CMOS of FIG. 1.

Next, a thin (e.g., 5 to 15 nanometers) highly doped (e.g., $10^{21}$ atoms per $cm^3$) of phosphorous doped (i.e., n- conductivity type) silicon (e.g. polycrystalline doped silicon or amorphous doped silicon) layer 50 is deposited, for example chemically vapor deposited) over the thermally grown silicon dioxide layer 31, as shown in FIG. 2A.

Figure 2B:
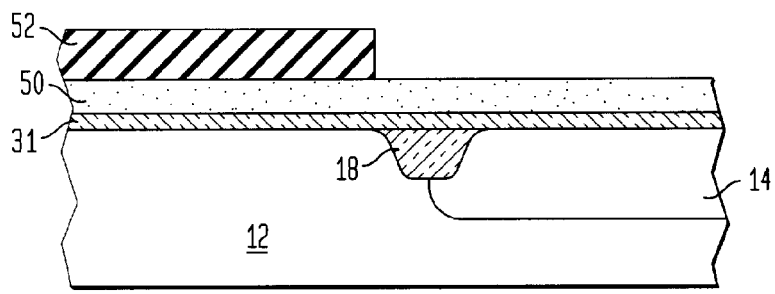

Next, referring to FIG. 2B, a layer 52 of photoresist is deposited over the thin, highly doped silicon layer. The photoresist layer 52 is photolithographically patterned as shown, using conventional lithographic technique. It is noted that the patterned photoresist layer 52 is disposed over one of the isolated regions, here the isolated region in which the NFET 12 (FIG. 1) will be formed and such photoresist layer 52 is removed over the other one of the isolated regions, here the isolated region in which the PFET 14 (FIG. 1) will be formed.

Next, using the patterned photoresist layer 52 as an etch mask, the surface of the structure shown in FIG. 2B is subjected to a suitable etch which selectively removes the doped silicon layer 50 but does not attack the underlying thermally grown silicon dioxide layer 31. After the etch, the patterned photoresist layer 52 is removed resulting in the structure shown in FIG. 2C. That is, the step removes the portions of the doped silicon layer 50 from areas which will have exclusively p-type region 42 of gate 40 (FIG. 1).

Figure 2C:
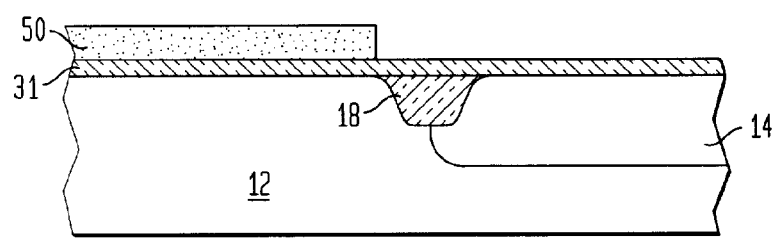
Figure 2D:
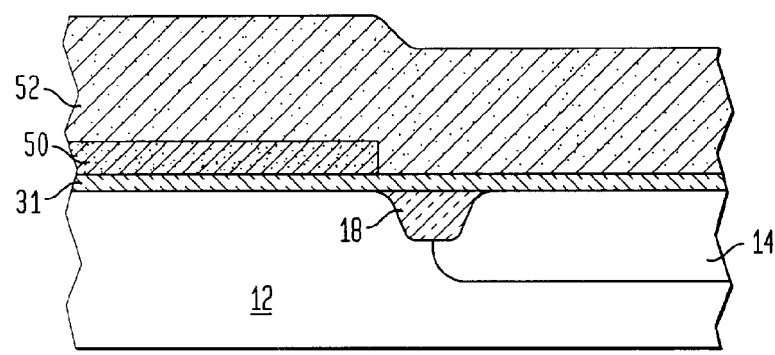

Next, a layer 52 of doped silicon, here doped polycrystalline silicon is deposited over the surface of the structure shown in FIG. 2C, to thereby produce the structure shown in FIG. 2D. Here, the dopant in the doped silicon layer 52 is boron (i.e., a p-conductivity type dopant) at a moderate doping concentration level, e.g., here about $10^{20}$ atoms per $cm^3$. The thickness of layer 52 is here about 100 to 200 nanometers for a gate width of 0.25 micrometers, for example. Here, the boron doped silicon layer 52 is chemically vapor deposited polycrystalline or amorphous silicon. It is noted that the chemical vapor deposition is a conformal deposition i.e., provides a uniform thickness to layer 52.

Referring now to FIG. 2D, the upper surface of the thicker, conformally chemically vapor deposited layer 52. It is noted that the ratio of the thickness of layer 52 to layer 50 is ten to one, and therefore such difference in thickness is not shown to scale in FIG. 2D. Because of this 0:1 ratio in thickness planaraization, for example using chemical mechanical polishing, is not required. Next a metal layer 54, here, for example, tungsten silicide is deposited over the surface followed by a layer 56 of silicon nitride. Next, a layer of photoresist layer 58 is deposited over the silicon nitride layer 56. The photoresist layer 58 is photolithographically patterned as shown, using conventional lithographic technique, to cover the gate channel regions 34, 36 (FIG. 1) in the silicon substrate 10. Thus, photoresist layer 52 is patterned to delineate the gate stack for the gates 38, 40 of the pair of FETS 12, 14, respectively (FIG. 1).

Figure 2E:
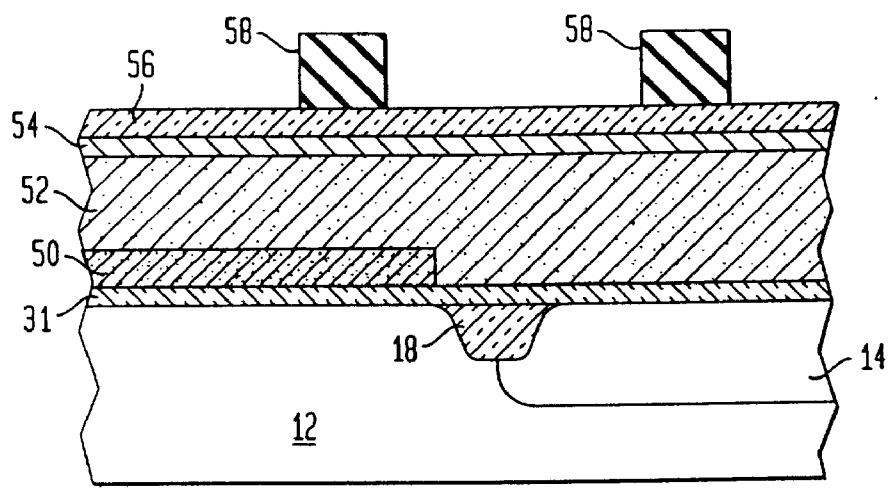
Figure 2F:
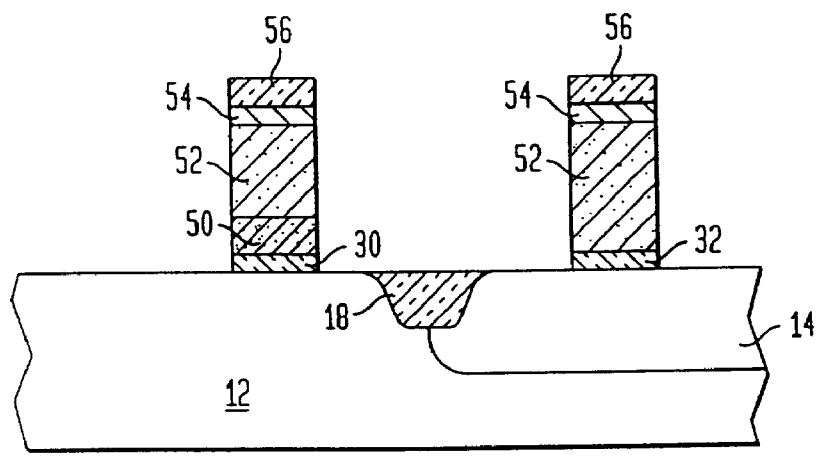
Figure 3A:
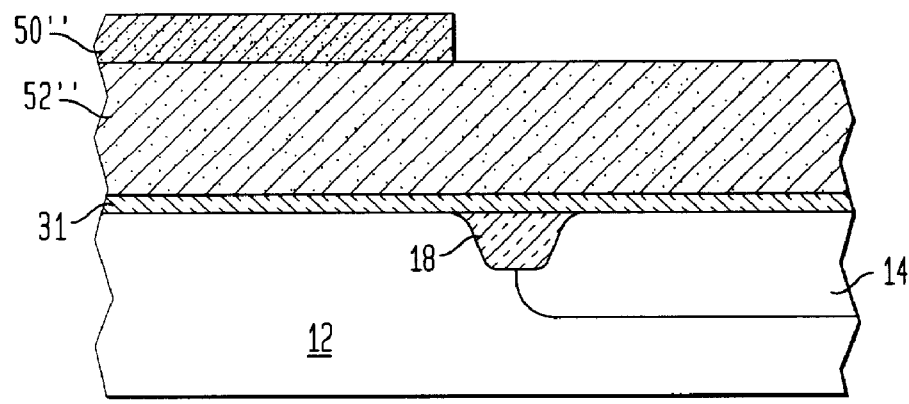
FIGS. 3A–3C are cross-sectional diagrammatical sketches of a semiconductor body at various stages in the processing thereof in accordance with the another embodiment of the invention.
Figure 3B:
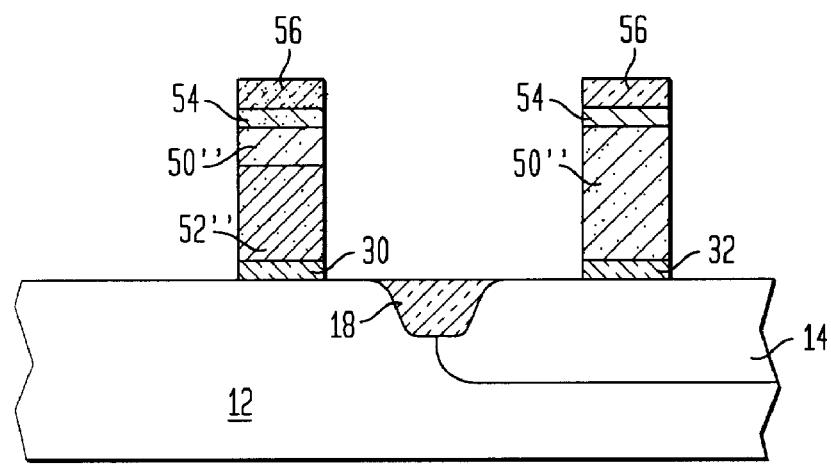

Referring now to FIG. 2F, using the patterned photoresist layer 58 (FIG. 2E) as an etch mask, the surface of the structure shown in FIG. 2E is subjected to suitable etching steps which selectively removes the exposed portions of the silicon nitride layer 56, tungsten silicide layer 54, doped silicon layers 52, 50 and thermally grown silicon dioxide layer 31. After the etch, the patterned photoresist layer 52 is removed resulting in the structure shown in FIG. 2F. The selective etching of the silicon dioxide layer 31 (FIG. 3E) results in the delineation of the gate oxide pads 30, 32 (FIG. 1).

Figure 2G:
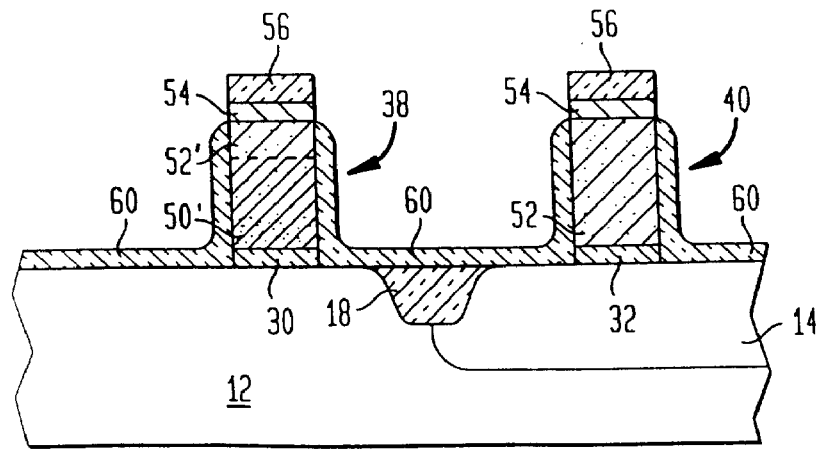

Next, referring to FIG. 2G, the structure shown in FIG. 2F is heated in an oxidizing atmosphere to form silicon dioxide sidewalls 60, as indicated. The temperature, and duration, of the heating is selected to redistribute the dopant in the highly doped layer 50 (FIG. 2F) resulting in a smoothing of the dopant profile, as indicated in FIG. 2G. That is, the heating distributes the dopant in the layer 50 among a lower portion of the dopant in such layer 52. Thus, the gate 38 has a lower region 50' wherein the n type dopant in layer 50 is now distributed vertically into the lower portion of layer 52. The upper region 52' of gate 38 has a thinner region of p-type dopant that in layer 52. It should be noted that in order to suppress dopant penetration into the gate oxide pads 30, 32, subsequent to the thermal oxidation used to for the gate oxide layer 31 (FIG. 1) described in connection with FIG. 2A, and prior to the deposition of the highly doped silicon layer 50, the structure is subjected to a nitrogen environment to nitrogenate the thermally grown silicon dioxide layer 31.

Figure 3C:
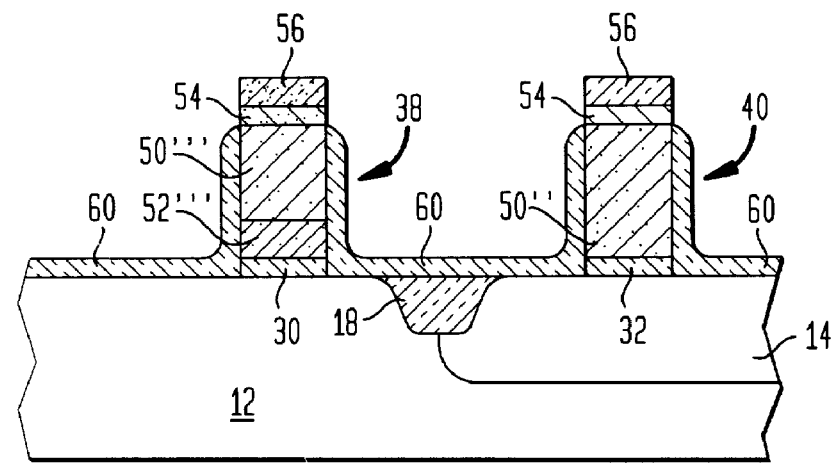

Other embodiments are within the spirit and scope of the appended claims. For example, the lower layer of doped polycrystalline or amorphous silicon may be the more thinner of the two doped one of the two layers used to form one of the gate electrodes. Further, the lower one of the layers may be the thicker of the two layers. Thus, referring to FIG. 3A, an example where the lower doped polycrystalline or amorphous silicon layer is the thicker, more lightly doped layer 52" and more upper layer is the thinner, more heavily doped layer 50", after such upper layer 50" has been patterned by the mask 52, as in FIG. 2B, is shown. After, the structure heated in an oxidizing atmosphere to form silicon dioxide sidewalls 60, as indicated in FIG. 3C. The temperature, and duration, of the heating is selected to redistribute the dopant in the highly doped layer 50" resulting in a smoothing of the dopant profile, as indicated in FIG. 3C.

What is claimed is:

1. A pair of field effect transistors, comprising:
   a semiconductor substrate;
   a gate oxide disposed over a surface of the substrate;

a first gate for a first one of the transistors disposed over a first portion of the gate oxide, such first gate comprising a first region having a first dopant;

a second gate for a second one of the transistors disposed over a second portion of the gate oxide, such second portion of the gate oxide being laterally spaced from the first portion of the gate oxide, the second gate comprising a pair of vertically disposed doped semiconductor regions the dopant of a first one of the pair of doped regions being different from the dopant in a second one of the pair of doped regions, the dopant in the first one of the pair of doped regions being distributed into an adjacent portion of the second one of the pair of vertically disposed doped regions, the dopant of the second one of the pair of doped regions being of the same as the dopant in the first region.

2. The transistors recited in claim 1 wherein a portion of the dopant in the first one of the pair of doped regions is distributed among a lower portion of the second one of the pair of vertically disposed doped regions in such second gate.

3. The transistors recited in claim 1 wherein the first gate comprises doped silicon.

4. The transistor recited in claim 3 wherein the silicon is polycrystalline or amorphous silicon.

5. The transistors recited in claim 1 wherein the first gate comprises doped silicon and the pair of regions of the second gate comprise silicon.

6. The transistors recited in claim 5 wherein the silicon is polycrystalline or amorphous silicon.

7. The transistors recited in claim 6 wherein a portion of the dopant in the first one of the pair of doped regions is distributed among a lower portion of the second one of the pair of vertically disposed doped regions in such second gate.

8. A pair of field effect transistors, comprising:

a semiconductor substrate;

a gate oxide disposed over a surface of the substrate;

a first gate for a first one of the transistors disposed over a first portion of the gate oxide, such first gate comprising a first conductivity type dopant;

a second gate for a second one of the transistors disposed over a second, laterally spaced portion of the gate oxide, the second gate comprising a pair of vertically disposed doped semiconductor regions, the dopant of a first one of the pair of doped regions being a second conductivity type dopant, such second type dopant being distributed gradually into contiguous portions of a second one of the pair of doped regions being a first conductivity type dopant, such first conductivity type dopant being opposite to the second conductivity type dopant.

9. The transistors recited in claim 8 wherein a portion of the second conductivity type dopant in the second gate is distributed among a lower portion of the first conductivity type dopant in such second gate.

10. The transistors recited in claim 8 wherein the first gate comprises doped silicon.

11. The transistor recited in claim 10 wherein the silicon is polycrystalline or amorphous silicon.

12. The transistors recited in claim 8 wherein the first gate comprises doped silicon and the pair of regions of the second gate comprise silicon.

13. The transistors recited in claim 12 wherein the silicon is polycrystalline or amorphous silicon.

14. The transistors recited in claim 13 wherein a portion of the second conductivity type dopant in the second gate is distributed among a lower portion of the first conductivity type dopant in such second gate.

* * * * *